US008798950B2

(12) United States Patent
Nikolic et al.

(10) Patent No.: US 8,798,950 B2
(45) Date of Patent: Aug. 5, 2014

(54) SYSTEM AND METHOD FOR ULTRASONIC TRANSDUCER CONTROL

(75) Inventors: Neven Nikolic, Mississauga (CA); Manja Kircanski, Toronto (CA); Nenad Kircanski, Toronto (CA); Amir M. Sadri, Toronto (CA); Milija Timotijevic, Toronto (CA); Zhiliang Xu, Mississauga (CA)

(73) Assignee: Bio-Rad Laboratories, Inc., Hercules, CA (US)

( * ) Notice: Subject to any disclaimer, the term of this patent is extended or adjusted under 35 U.S.C. 154(b) by 791 days.

(21) Appl. No.: 12/860,226

(22) Filed: Aug. 20, 2010

(65) Prior Publication Data

US 2012/0046765 A1    Feb. 23, 2012

(51) Int. Cl.
*G06F 17/00* (2006.01)
*B06B 1/02* (2006.01)
*H01L 41/04* (2006.01)

(52) U.S. Cl.
CPC ............. *B06B 1/0253* (2013.01); *H01L 41/042* (2013.01)
USPC .................. 702/85; 702/64; 702/75; 310/317; 700/90

(58) Field of Classification Search
USPC ................................ 702/85, 64, 75; 310/317
See application file for complete search history.

(56) References Cited

U.S. PATENT DOCUMENTS

| | | | |
|---|---|---|---|
| 4,901,034 A | 2/1990 | Frank-Peter | |
| 5,532,539 A | 7/1996 | Hielscher | |
| 5,818,714 A * | 10/1998 | Zou et al. | ......................... 700/37 |
| 5,900,690 A | 5/1999 | Gipson et al. | |
| 6,819,027 B2 | 11/2004 | Saraf | |
| 7,270,646 B2 | 9/2007 | Sakurai et al. | |
| 7,476,233 B1 | 1/2009 | Wiener et al. | |
| 2005/0052095 A1 | 3/2005 | Kasai et al. | |
| 2006/0030038 A1 | 2/2006 | Taylor et al. | |

(Continued)

FOREIGN PATENT DOCUMENTS

| | | |
|---|---|---|
| JP | 53-79175 | 7/1978 |
| JP | 62-182901 | 8/1987 |

(Continued)

OTHER PUBLICATIONS

Kemar et al., Middle East Technical University, Electrical & Electronics Engineering, "PI, PD, PID Controllers", 2012.*

(Continued)

*Primary Examiner* — Jonathan C Teixeira Moffat
*Assistant Examiner* — Hien Vo
(74) *Attorney, Agent, or Firm* — Kilpatrick Townsend & Stockton LLP

(57) ABSTRACT

A system for controlling an ultrasonic transducer utilizes an indication of the relative phase of the voltage on the transducer and the current passing through the transducer to control the relative phase to a value that has been preselected to correspond to resonance of an electromechanical system that includes the ultrasonic transducer. In one example application, the system includes a waveform generator that produces an oscillating signal, and the frequency of the oscillating signal is adjustable under control of the control processor. The control processor adjusts the frequency of the oscillating signal according to a proportional control law at least some of the time, and according to a proportional-integral control law at least some of the time. The control processor may also control the amplitude of the oscillation of the ultrasonic transducer.

40 Claims, 6 Drawing Sheets

(56) References Cited

U.S. PATENT DOCUMENTS

| | | |
|---|---|---|
| 2007/0016020 A1 | 1/2007 | Oshiki et al. |
| 2007/0248958 A1 | 10/2007 | Jovanovich et al. |
| 2010/0102672 A1 | 4/2010 | Hoffman et al. |
| 2011/0130560 A1 | 6/2011 | Sadri et al. |

FOREIGN PATENT DOCUMENTS

| | | |
|---|---|---|
| JP | 6-63507 | 3/1994 |
| JP | 2002-191611 | 7/2002 |
| JP | 2010-131477 | 6/2010 |
| WO | 2010/048594 | 4/2010 |

OTHER PUBLICATIONS

International Search Report and Written Opinion of PCT/US2010/036546 mailed on Jul. 21, 2010, 8 pages.

International Search Report and Written Opinion of PCT/US2011/048494 mailed on Dec. 14, 2011, 10 pages.

Office action in related Japanese application No. 2013-523387, issued on Apr. 1, 2014.

* cited by examiner

SYSTEM AND METHOD FOR ULTRASONIC TRANSDUCER CONTROL

BACKGROUND OF THE INVENTION

Ultrasonic transducers are used in a variety of applications to create high frequency vibration of a vibrating element. The vibrating element may in turn be used to atomize a liquid, clean delicate objects such as jewelry, cut and coagulate tissue during surgical procedures, disrupt tissues in the process of sample preparation in a microbiological lab, or to perform another operation. For the purposes of this disclosure, an ultrasonic transducer is a device that is supplied with an oscillating electrical signal, such as a voltage, and causes an ultrasonic mechanical oscillation of a vibrating element. The mechanical vibration typically occurs fundamentally at the same frequency as the frequency of the applied oscillating electrical signal. An ultrasonic transducer may include, for example, a piezoelectric element that changes its geometry in response to changes in applied voltage. In some applications, the mechanically vibrating element may be called an end effector, and may be a probe, blade, or other device. Depending on the application, an end effector may freely vibrate in air or liquid, or may come in contact with tissue or other objects. The transducer and end effector may have a resonant frequency at which the amplitude of vibration of the end effector is maximized.

BRIEF SUMMARY OF THE INVENTION

Embodiments of the invention relate to systems and methods for controlling an ultrasonic transducer. In some embodiments, the transducer is actively controlled to oscillate at a resonant frequency. Control of the amplitude of vibration may also be provided.

In accordance with embodiments, a system for controlling an ultrasonic transducer comprises a control processor, a waveform generator that produces an oscillating signal the frequency of which is adjustable under control of the control processor, power circuitry that receives the oscillating signal and drives the ultrasonic transducer to vibrate at the frequency of the oscillating signal, a current sensing circuit that senses the current passing through the ultrasonic transducer, a voltage sensing circuit that senses the voltage on the ultrasonic transducer, and a phase detection circuit that receives signals from the current sensing circuit and the voltage sensing circuit and produces an indication of the relative phase of the voltage and the current and provides the indication to the control processor. The control processor is configured to repeatedly read the indication of the relative phase of the voltage and the current and adjust the frequency of the oscillating signal so as to control the indication of relative phase of the voltage and the current to a value that has been preselected to correspond to resonance of an electromechanical system that includes the ultrasonic transducer. The control processor adjusts the frequency of the oscillating signal according to a proportional-integral control law. In some embodiments, the power circuitry further comprises a power amplifier that receives the oscillating signal and produces an amplified oscillating signal, and a high frequency transformer that includes a primary winding and a secondary winding, wherein the primary winding receives the amplified oscillating signal and the secondary winding is coupled to the ultrasonic transducer.

In some embodiments, the control processor is further configured to upon initiation of control adjust the frequency of the oscillating signal according to a proportional control law, detect that the relative phase of the voltage and the current has reached the preselected value for a first time, and then adjust the frequency of the oscillating signal according to a proportional-integral control law. The indication of the relative phase of the voltage and the current may be a measure of the time delay between a current waveform and a voltage waveform. The amplitude of the oscillating signal may be adjustable under control of the control processor.

According to some embodiments, the control processor receives a signal from the current sensing circuit, and the control processor is further configured to receive a specification of a desired ultrasonic transducer vibration amplitude, derive a desired current magnitude from the desired ultrasonic transducer vibration amplitude, and repeatedly read the signal received from the current sensing circuit and adjust the amplitude of the oscillating signal so as to control the current passing through the ultrasonic transducer to the desired current magnitude. The control of the current passing through the ultrasonic transducer may be performed according to a proportional-integral control law at least some of the time. For example, the control processor may be configured to upon initiation of control, control the current passing through the ultrasonic transducer according to a proportional control law, detect that the current passing through the ultrasonic transducer has reached the desired current magnitude for a first time, and then control the current passing through the ultrasonic transducer according to a proportional-integral control law. In some embodiments, the control processor is further configured to compare the magnitude of the voltage on the ultrasonic transducer with a preselected maximum transducer voltage, and when the magnitude of the voltage on the ultrasonic transducer exceeds the preselected maximum transducer voltage, adjust the amplitude of the oscillating signal so as to control the voltage on the ultrasonic transducer to the preselected maximum transducer voltage. The control of the voltage on the ultrasonic transducer may be performed according to a proportional control law.

In some embodiments, the control processor may receive a signal from the voltage sensing circuit, and may be further configured to receive a specification of a desired ultrasonic transducer vibration amplitude, derive a desired voltage magnitude from the desired ultrasonic transducer vibration amplitude, and repeatedly read the signal received from the voltage sensing circuit and adjust the amplitude of the oscillating signal so as to control the voltage on the ultrasonic transducer to the desired voltage magnitude. The control of the voltage on the ultrasonic transducer may be performed according to a proportional-integral control law at least some of the time. For example, the control processor may be configured to upon initiation of control, control the voltage on the ultrasonic transducer according to a proportional control law, detect that the voltage the ultrasonic transducer has reached the desired voltage magnitude for a first time, and then control the voltage on the ultrasonic transducer according to a proportional-integral control law. The control processor may be further configured to compare the magnitude of the current passing through the ultrasonic transducer with a preselected maximum transducer current, and when the magnitude of the current passing through the ultrasonic transducer exceeds the preselected maximum transducer current, adjust the amplitude of the oscillating signal so as to control the current passing through the ultrasonic transducer to the preselected maximum transducer current. The control of the current passing through the ultrasonic transducer may be performed according to a proportional control law.

In some embodiments, the control processor receives signals from the current sensing circuit and from the voltage sensing circuit, and the control processor is further configured to receive a specification of a desired ultrasonic transducer vibration amplitude, derive a desired power level from the desired ultrasonic transducer vibration amplitude, and repeatedly read the signal received from the voltage sensing circuit and the signal received from the current sensing circuit, compute a power level being supplied to the transducer, and adjust the amplitude of the oscillating signal so as to control the power being supplied to the ultrasonic transducer to the desired power level. The control of the power being supplied to the ultrasonic transducer may be performed according to a proportional-integral control law at least some of the time. In some embodiments, the control processor is configured to upon initiation of control, control the power being supplied to the ultrasonic transducer according to a proportional control law, detect that the power being supplied to the ultrasonic transducer has reached the desired power level for a first time, and then control the power being supplied to the ultrasonic transducer according to a proportional-integral control law. The control processor may be further configured to compare the magnitude of the voltage on the ultrasonic transducer with a preselected maximum transducer voltage, and when the magnitude of the voltage on the ultrasonic transducer exceeds the preselected maximum transducer voltage, adjust the amplitude of the oscillating signal so as to control the voltage on the ultrasonic transducer to the preselected maximum transducer voltage. The control of the voltage on the ultrasonic transducer may be performed according to a proportional control law.

In some embodiments, the control processor is further configured to upon initiation of control adjust the amplitude of the oscillating signal to a preselected level and control the frequency of the oscillating signal without adjusting its amplitude, detect that a resonant frequency of the electromechanical system has been reached for a first time, and then repeatedly adjust both the frequency and amplitude of the oscillating signal.

According to other embodiments, a method of controlling an ultrasonic transducer comprises repeatedly sensing the current passing through the ultrasonic transducer, sensing the voltage on the ultrasonic transducer, deriving an indication of the relative phase of the voltage and the current, and sending a command to a waveform generator to adjust a frequency at which the ultrasonic transducer is driven, so as to control the indication of relative phase of the voltage and the current to a value that has been preselected to correspond to resonance of an electromechanical system that includes the ultrasonic transducer. The frequency is adjusted according to a proportional-integral control law. In some embodiments, the frequency is adjusted according to a proportional control law until the preselected value of the phase indication is reached for a first time, and then the frequency is adjusted according to a proportional-integral control law. In some embodiments, the method further includes measuring a time delay between a current waveform and a voltage waveform, and using the measured time delay as the indication of the relative phase of the voltage and the current. The method may further include controlling the amplitude of oscillation of the ultrasonic transducer.

In some embodiments, controlling the amplitude of oscillation of the ultrasonic transducer may further include controlling the current passing through the ultrasonic transducer to a magnitude that corresponds to a desired amplitude of oscillation of the ultrasonic transducer. The current may be controlled according to a proportional-integral control law at least some of the time. In some embodiments, the method further comprises upon initiation of control controlling the current passing through the ultrasonic transducer according to a proportional control law, detecting that the current passing through the ultrasonic transducer has reached the magnitude corresponding to the desired amplitude for a first time, and then controlling the current passing through the ultrasonic transducer according to a proportional-integral control law. The method may further comprise, when the magnitude of the voltage on the ultrasonic transducer does not exceed a preselected maximum transducer voltage, controlling the current passing through the ultrasonic transducer to a magnitude that corresponds to a desired amplitude of oscillation of the ultrasonic transducer, and when the magnitude of the voltage on the ultrasonic transducer exceeds the preselected maximum transducer voltage, controlling the voltage on the ultrasonic transducer to the preselected maximum transducer voltage. The control of the voltage on the ultrasonic transducer may be performed according to a proportional control law.

In some embodiments, controlling the amplitude of oscillation of the ultrasonic transducer may further include controlling the voltage on the ultrasonic transducer to a magnitude that corresponds to a desired amplitude of oscillation of the ultrasonic transducer. The voltage may be controlled according to a proportional-integral control law at least some of the time. In some embodiments, the method further comprises upon initiation of control controlling the voltage on the ultrasonic transducer according to a proportional control law, detecting that the voltage on the ultrasonic transducer has reached the magnitude corresponding to the desired amplitude for a first time, and then controlling the voltage on the ultrasonic transducer according to a proportional-integral control law. The method may further comprise when the magnitude of the current passing through the ultrasonic transducer does not exceed a preselected maximum transducer current, controlling the voltage on the ultrasonic transducer to a magnitude that corresponds to a desired amplitude of oscillation of the ultrasonic transducer, and when the magnitude of the current passing through the ultrasonic transducer exceeds the preselected maximum transducer current, controlling the current passing through the ultrasonic transducer to the preselected maximum transducer current. The control of the current passing through the ultrasonic transducer may be performed according to a proportional control law.

In some embodiments, controlling the amplitude of oscillation of the ultrasonic transducer may further include controlling the amount of power being supplied to the ultrasonic transducer to a value that corresponds to a desired amplitude of oscillation of the ultrasonic transducer. The power may be controlled according to a proportional-integral control law at least some of the time. In some embodiments, the method further comprises upon initiation of control controlling the amount of power being supplied to the ultrasonic transducer according to a proportional control law, detecting that the amount of power being supplied to the ultrasonic transducer has reached the value corresponding to the desired amplitude for a first time, and then controlling the amount of power being supplied to the ultrasonic transducer according to a proportional-integral control law. The method may further comprise when the magnitude of the voltage on the ultrasonic transducer does not exceed a preselected maximum transducer voltage, controlling the amount of power being supplied to the ultrasonic transducer to a value that corresponds to a desired amplitude of oscillation of the ultrasonic transducer, and when the magnitude of the voltage on the ultrasonic transducer exceeds the preselected maximum transducer voltage, controlling the voltage on the ultrasonic transducer to the preselected maximum transducer voltage.

The control of the voltage on the ultrasonic transducer may be performed according to a proportional control law.

In some embodiments, the method further comprises upon initiation of control setting the amplitude of oscillation of the ultrasonic transducer to a preselected level and controlling the frequency of oscillation of the ultrasonic transducer without adjusting its amplitude, detecting that the preselected value of the indication of relative phase of the voltage and current corresponding to the resonant frequency of the electromechanical system has been reached for a first time, and then controlling both the frequency and amplitude of the oscillation of the ultrasonic transducer.

DETAILED DESCRIPTION OF THE INVENTION

Figure 1:
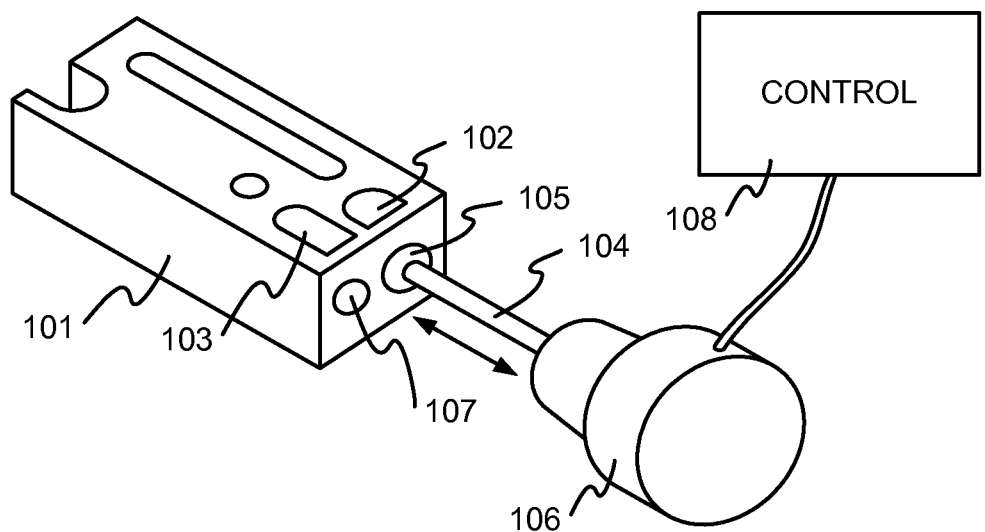
FIG. 1 illustrates a system that may be used for disruption of tissue in a microbiological laboratory, and in which embodiments of the invention may find utility.

An electromechanical system such as a transducer and end effector may have a resonant frequency at which the amplitude of the vibration of the end effector is maximized for a particular input electrical signal amplitude. For example, FIG. 1 illustrates a system that may be used for disruption of tissue in a microbiological laboratory, and in which embodiments of the invention may find utility. Tissue disruption may be an initial step in the collection of nucleic acids for further analysis.

In the system of FIG. 1, a cartridge 101 includes various wells, for example a sample well 102 and a mixing well 103. A tissue sample may be placed in sample well 102 and subjected to ultrasonic vibration from end effector 104, which transmits vibration through flexible window 105. End effector 104 is driven by an ultrasonic transducer 106 to oscillate longitudinally at an ultrasonic frequency. In some embodiments, the frequency may be nominally about 30 KHz, for example. In a later processing step, the disrupted tissue may be transferred through passages in cartridge 101 to mixing well 103, and ultrasonic transducer 106 and end effector 104 moved to contact window 107 to subject the contents of mixing well 103 to further ultrasonic vibration. Further transfers and processing steps may be performed. The system of FIG. 1 is highly simplified, and certain components have been omitted for ease of explanation. More details about this use of ultrasonic vibration may be found in co-pending U.S. patent application Ser. No. 12/788,777 titled "Sonication Cartridge for Nucleic Acid Extraction", filed May 27, 2010, the entire disclosure of which is hereby incorporated by reference herein.

Embodiments of the invention may also find utility in many other kinds of systems that utilize ultrasonic transducers, for example cleaning systems, surgical systems, and others.

In the system of FIG. 1, ultrasonic transducer 106 is controlled by controller 108. For efficient operation, it is desirable that ultrasonic transducer 106 be driven at the resonant frequency of the electromechanical system that includes ultrasonic transducer 106. However, the resonant frequency may change with ambient temperature, heating of ultrasonic transducer 106 during use, wear of end effector 104 or other components, variations in the external load applied to end effector, and other factors. Thus, embodiments of the invention provide closed loop feedback control of the frequency at which an ultrasonic transducer, such as ultrasonic transducer 106, is driven.

In addition, it is desirable that the amplitude of vibration be adjustable by a user of an ultrasonic device. Accordingly, embodiments of the invention also provide closed loop feedback control of the amplitude of oscillation. In some uses, an ultrasonic transducer such as ultrasonic transducer 106 may be operated in a pulsed mode, so it is desirable that any amplitude control react quickly to changes in specified amplitude.

Figure 2:
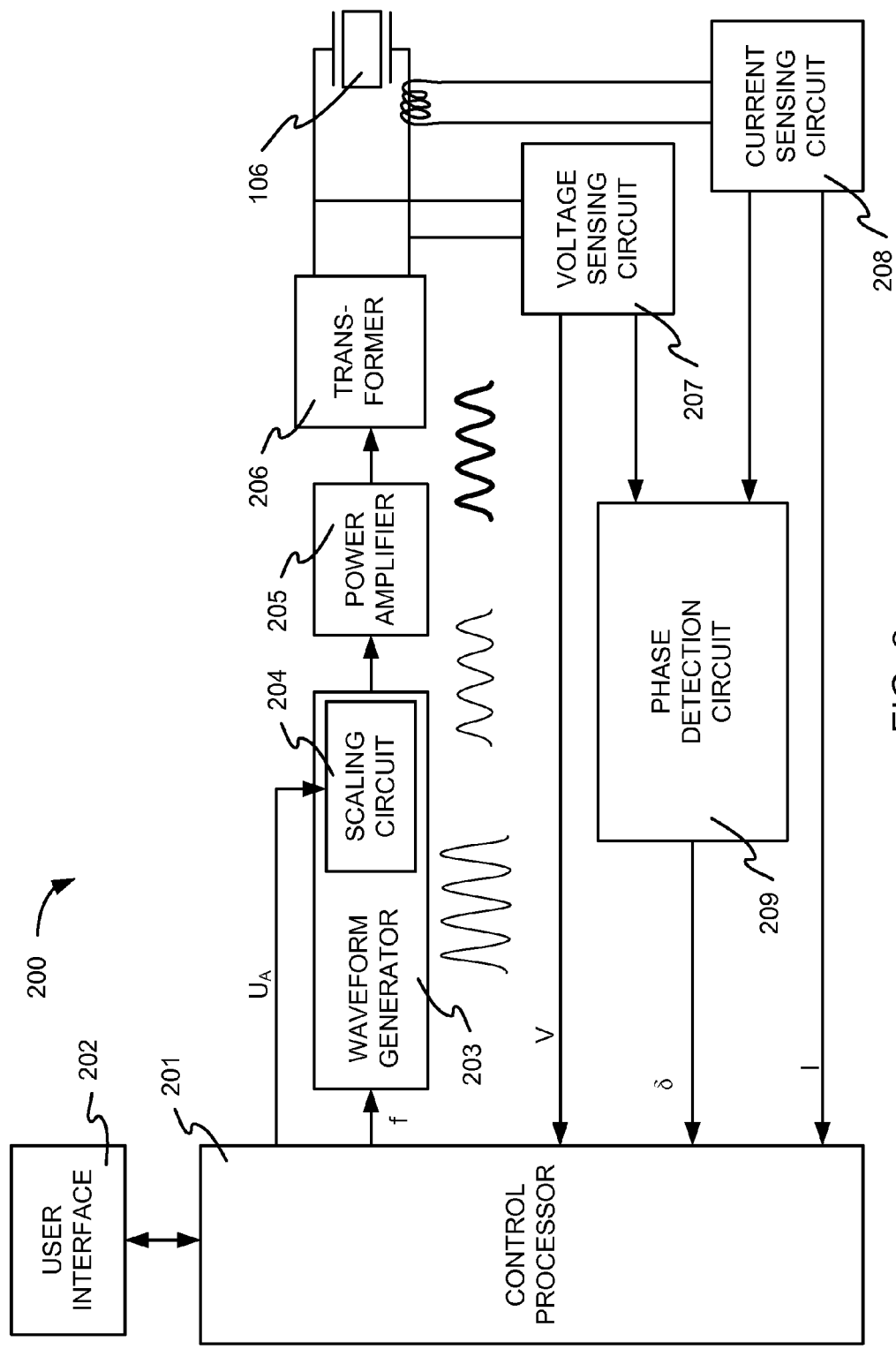
FIG. 2 illustrates a simplified block diagram of a system for controlling an ultrasonic transducer, in accordance with embodiments of the invention.

FIG. 2 illustrates a simplified block diagram of a system 200 for controlling an ultrasonic transducer, in accordance with embodiments of the invention. Example system 200 includes a control processor 201. Control processor 201 may comprise, for example, a microprocessor, microcontroller, digital signal processor, programmable gate array, or other circuitry suitable for performing closed loop control of ultrasonic transducer 106. While control processor 201 is shown as a monolithic block, it may include multiple electronic components. For example, external memory may be provided for holding instructions that when executed by control processor 201 cause control processor 201 to perform the control functions described below. Control processor 201 may receive settings, instructions, or other information via user interface 202, and may display information about its operation via user interface 202.

Exemplary system 200 further includes a waveform generator 203 that produces an oscillating voltage signal. The oscillating voltage signal may be sinusoidal, substantially sinusoidal, or of another wave shape, such as a square wave, a triangle wave, a sawtooth wave, or other wave shape. The frequency of the generated signal is adjustable under control of control processor 201. For example, waveform generator 203 may utilize a model AD9833 Low Power Programmable Waveform Generator available from Analog Devices, Inc. of Norwood, Mass., USA. When an AD9833 waveform generator is used, control processor 201 can provide a digital command, represented by signal f, to waveform generator 203 specifying the frequency of the oscillating voltage signal to be produced by waveform generator 203. In other embodiments, waveform generator 203 may include a current generator, and the oscillating signal produced by waveform generator 203 may be a current signal, rather than a voltage signal. For the purposes of this disclosure, references to a "frequency" of a signal refer to the fundamental frequency of the signal.

Waveform generator 203 may further include a scaling circuit 204, which, under the control of control processor 201, adjusts the amplitude of the oscillating signal. Scaling circuit 204 may comprise, for example, a programmable gain amplifier that adjusts its gain in response to a digital command, represented by signal $U_A$, from control processor 201, or may comprise a potentiometer utilizing a digital resistor. A digital resistor is a device that adjusts its apparent resistance in response to a digital command. Power circuitry may then receive the oscillating signal from waveform generator 203 and provide sufficient drive capability to drive ultrasonic transducer 106. For example, the power circuitry may include a power amplifier 205 that receives the oscillating signal produced by waveform generator 203 and produces an amplified oscillating signal. The power circuitry may also include a transformer 206. For example, transformer 206 may include a primary winding that receives the amplified oscillating signal from power amplifier 205, and a secondary winding that is coupled to ultrasonic transducer 106.

Thus, exemplary system 200 includes components that enable control processor 201 to specify both the frequency and amplitude of the signal that drives ultrasonic transducer 106.

Feedback about the operation of ultrasonic transducer 106 is provided to control processor 201 by a voltage sensing circuit 207, a current sensing circuit 208, and a phase detection circuit 209. While these sensing circuits are shown conceptually as three separate functional blocks, they may include other components that have been omitted from FIG. 2 for clarity of illustration. For example, one or more of the sensing circuits may include various filtering or other signal conditioning, a zero crossing detector, a counter, or other kinds of components. Phase detection circuit could be a separate device, or may be implemented in firmware or logic within control processor 201. Many other arrangements and variations are possible within the scope of the appended claims.

In example system 200, voltage sensing circuit 207 senses the voltage on the ultrasonic transducer, and current sensing circuit 208 senses the current passing through the ultrasonic transducer. For example, voltage sensing circuit 207 may provide a conditioned waveform representative of the voltage on ultrasonic transducer 106 to phase detection circuit 209 from which phase detection circuit 209 may detect zero crossings in the conditioned waveform. Voltage sensing circuit 207 may provide to control processor 201 an indication of the magnitude of the voltage on ultrasonic transducer 106. An indication of the magnitude of the voltage may be an indication of the peak voltage during recent voltage oscillations, an RMS voltage value, or another measurement. Current sensing circuit 208 may also provide a conditioned waveform representative of the current passing through ultrasonic transducer 106 to phase detection circuit 209 from which phase detection circuit 209 may detect zero crossings in the waveform. Current sensing circuit 208 may provide to control processor 201 an indication of the magnitude of the current passing through ultrasonic transducer 106, for example a peak or RMS measurement of the current. For the purposes of this disclosure, to control voltage or current means to control the magnitude of the voltage or current.

In embodiments of the invention, control processor 201 repeatedly reads information from one or more of voltage sensing circuit 207, current sensing circuit 208, and phase detection circuit 209, and adjusts the frequency, amplitude, or both of the oscillating signal produced by waveform generator 203 to effect closed loop feedback control of the behavior of ultrasonic transducer 106. The digital nature of control processor 201 enables a wide variety of control strategies, and enables switching between control strategies when conditions warrant. For example, control processor 201 can be configured to respond to changes in temperature, wear of end effector 104, changes in external load due to contact with tissue or another object, variation of mechanical properties of different transducers and end effectors due to manufacturing tolerances, or other conditions. The flexibility of digital control also provides for diagnosing system failures during operation or during the process of manufacturing the system.

Several exemplary control strategy embodiments will now be described.

Frequency Control

It has been observed that the relative phase relationship between voltage on an ultrasonic transducer and the current passing through the ultrasonic transducer is indicative of whether or not the transducer is operating at resonance. For a particular system, resonance occurs at approximately a fixed phase relationship between voltage and current. Accordingly, whether or not a particular ultrasonic transducer is operating at resonance can be determined by measuring the phase relationship between voltage and current and comparing the measured relationship with the known relationship corresponding to the resonance frequency. The resonance frequency and the corresponding voltage/current phase relationship may be determined during the design and development of the system. During operation, a departure from the resonance phase relationship indicates that the system is not operating at the resonance frequency. The direction of departure also indicates whether the operating frequency is below or above the resonance frequency. In practice, resonance may occur when the voltage on ultrasonic transducer 106 and the current passing through ultrasonic transducer 106 are in phase, with a relative phase of zero. However, phase detection circuit 209 or other components may introduce measurement delays such that the indication of phase produced by phase detection circuit 209 may be a nonzero value at resonance.

According to embodiments of the invention, control processor 201 is configured to repeatedly read the indication of the relative phase of the voltage and the current from phase detection circuit 209, and to adjust the frequency of the oscillating signal produced by waveform generator 203 so as to control the relative phase of the voltage and the current to a value that has been preselected to correspond to resonance of the electromechanical system that includes ultrasonic transducer 106. Control processor 201 may effect the adjustment of the frequency by sending digital commands f to waveform generator 203. As the resonance frequency changes due to temperature variations, loading variations, wear, or other factors, control processor 201 recognizes when the voltage/current phase relationship departs from the relationship corresponding to resonance, and adjusts the frequency of the oscillating signal produced by waveform generator 103 to control the phase relationship to the resonance value, and consequently control the operating frequency to the new resonance frequency.

During ongoing frequency control, control processor 201 may implement a proportional-integral control law according to $$\Delta f = k_{PF}(\delta_d - \delta) + k_{IF}\int(\delta_d - \delta)dt$$

where $\Delta f$ is the increment of oscillation frequency in each control period, $k_P$ and $k_I$ are proportional and integral gains for the frequency control loop, $\delta$ and $\delta_d$ are the measured and desired phase differences between the current and the voltage signals. In some embodiments, $\delta_d$ is preferably ascertained during development of a particular system and stored for use by control processor as needed. The ascertainment of actual phase difference $\delta$ is done by phase detection circuit 209, which provides an indication of the relative phase between voltage and current to control processor 201. In some embodiments, $\delta$ and $\delta_d$ may be actual phase measurements, for example measured in radians. In other embodiments, phase relationships may be approximated by time delay measurements between the voltage and current waveforms, for example the time delay between zero crossings of the voltage and current waveforms. Because the range of frequencies in which resonance occurs is narrow, time delay may be a sufficiently accurate proxy for actual phase difference, and the system may still control the frequency of operation to a value that is very close to the resonance frequency of the electromechanical system. Even if actual phase measurements are used in the control, the phase may be measured by measuring the time delay between the current and voltage waveforms, and then scaling the delay value according to the known operating frequency to ascertain the phase delay.

For the purposes of this disclosure, a control law is a formula, rule, or other scheme for determining a controlling signal based on a feedback signal. For example, in the control law given above, the controlling signal is Δf, the increment of oscillation frequency, and the feedback signal is $(\delta_d-\delta)$, the error between the desired and actual phase differences (or delays) between the current and voltage signals. Many kinds of control laws are possible. A proportional control law computes the controlling signal as a gain multiplied by the feedback indication. A proportional-integral control law computes the controlling signal as the sum of two terms—a proportional term that is a gain multiplied by the feedback signal, and an integral term that is a (usually different) gain multiplied by the time integral of the feedback signal since a starting time.

The control law given above is a proportional-integral control law in which the proportional term is $k_{PF}(\delta_d-\delta)$, and the integral term is $k_{IF}\int(\delta_d-\delta)dt$. Purely proportional control, in which the control signal Δf is computed as a gain multiplied by the phase (or time delay) error may result in steady-state errors in frequency. Adding the integral term may eliminate steady-state errors. However, the integral term may also result in larger overshoot in some cases, as large integral error may accumulate while the system adjusts the operating frequency from an initial value toward the value that corresponds to resonance. To reduce the tendency of the integral term to cause overshoot, the integral part of the control law may be introduced only when the system has achieved the desired resonance frequency for the first time in a particular control cycle. That is, upon initiation of control, the integral gain $k_{IF}$ may be set to zero (resulting in a proportional control law), and when the desired phase or delay has been achieved for the first time, $k_{IF}$ may be set to its design value (resulting in a proportional-integral control law).

The starting frequency value may be set to the minimum or maximum expected resonance frequency, as determined during product development for a particular design, or another suitable frequency. A fault state may be reported if, during control, the frequency reaches a value that is outside the range of expected frequencies. A particular ultrasonic transducer 106 should perform similarly to other units of the same design. During manufacturing, a frequency sweep may be performed on a particular unit to see that its resonance occurs within the expected range, and if not, improper manufacturing or assembly may be suspected.

Figure 3:
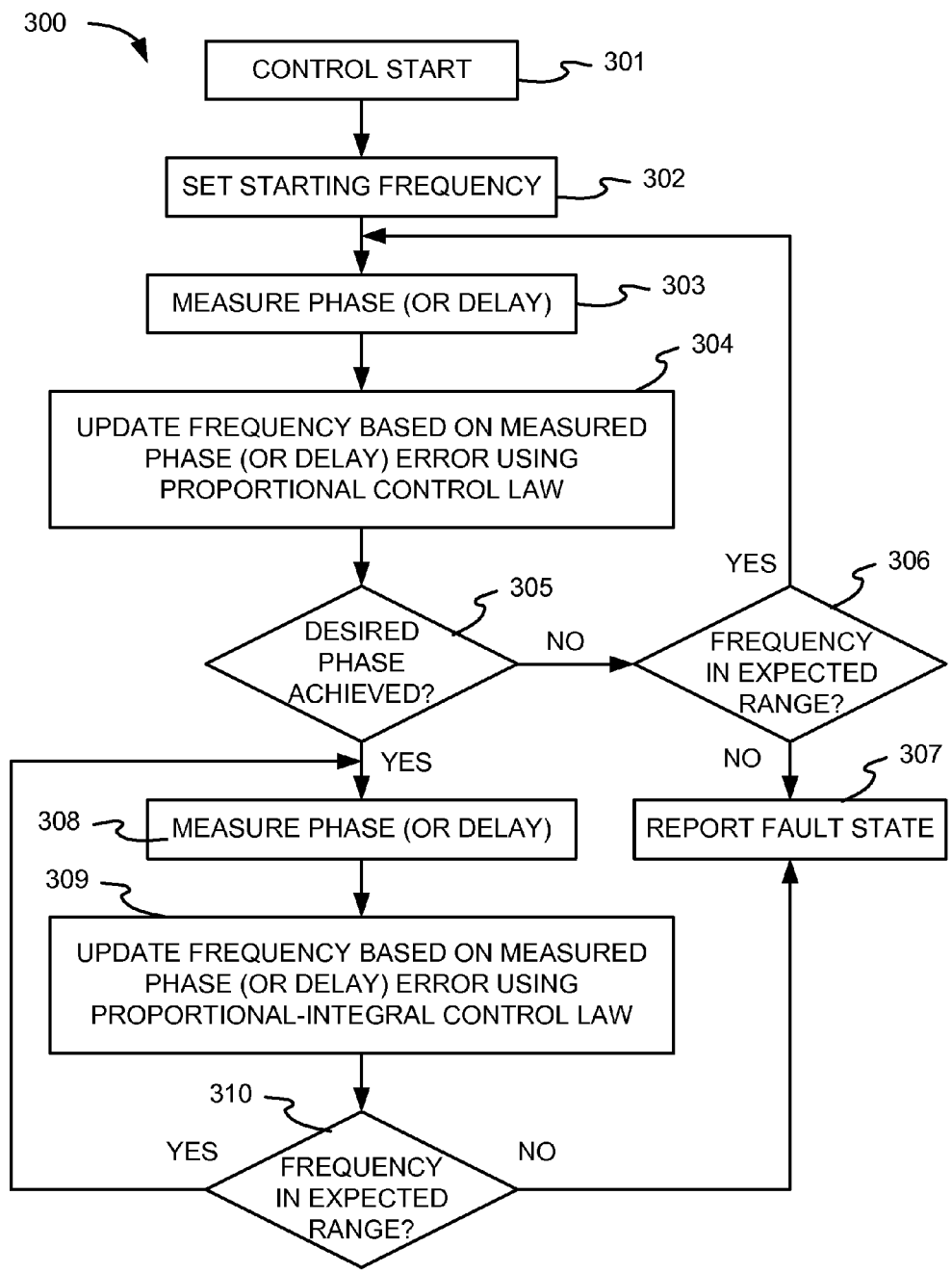
FIG. 3 is a flow chart illustrating a frequency control method according to embodiments of the invention.

FIG. 3 is a flow chart 300 illustrating a frequency control method according to embodiments of the invention. Upon initiation of control 301, a starting frequency is set at step 302. As is described above, the starting frequency may be the lowest or highest expected resonance frequency, or another frequency. The phase (or time delay) difference between voltage and current is measured in step 303, and the frequency is updated in step 304 based on the measured error using a proportional control law. At step 305, a check is performed to see if the desired phase (or time delay) corresponding to resonance has been achieved. If not, control passes to step 306 where a check is performed to see if the control frequency has reached a value outside the range of expected frequencies. If so, a fault state is reported at 307. If neither the desired phase (or delay) nor a frequency outside the expected range has been reached, control passes back to step 303.

Once the desired phase (or time delay) has been reached, control passes to step 308, where the phase (or delay) is measured, and then the frequency is updated in step 309 based on the measured error using a proportional-integral control law. At step 310, a check is again performed to see if a frequency outside the expected range has been achieved. If not, control passes back to step 308. If so, a fault state is reported in step 307.

Amplitude Control

According to some embodiments, control processor 201 also controls the amplitude of oscillations of ultrasonic transducer 106. For example, a user may indicate using user interface 202 that a particular amplitude is desired. Control processor 201 may ascertain a value of a control variable corresponding to the desired amplitude, and control that variable to the value to a value corresponding to the desired amplitude. In different embodiments, the control variable may be the current passing through ultrasonic transducer 106, the voltage on ultrasonic transducer 106, or the power being supplied to ultrasonic transducer 106. In each case, control processor 201 may effect control of the control variable by adjusting the amplitude of the signal produced by waveform generator 203. Also, control processor 201 may perform checks to ensure that ultrasonic transducer 106 is not overdriven. For example, a limiting variable may be monitored, and may be controlled to a preselected maximum value rather than let the limiting variable exceed its preselected maximum value.

The desired amplitude may change relatively slowly, for example in response to a user input knob or other control. In other cases, the desired amplitude may change very rapidly, for example when ultrasonic transducer 106 is operated in a pulsed mode, wherein oscillation is switched on and off according to a duty cycle. In the pulsed mode, the desired amplitude may change nearly instantaneously from a low value—usually zero in the "off" portions of the duty cycle—to a higher value during the "on" portions of the duty cycle.

Current Based Amplitude Control

According to some embodiments, the control variable for controlling amplitude is the current being supplied to ultrasonic transducer 106, the limiting variable is the voltage on ultrasonic transducer 106, and control is performed using a control law according to $$\Delta U_A = \begin{cases} k_{PA}(I_d - I) + k_{IA}\int(I_d - I)dt, & V \leq V_{max} \\ k_{PV}(V_{max} - V), & V > V_{max} \end{cases}$$

where $\Delta U_A$ is the increment of the amplitude control variable in each control period, $k_{PA}$ and $k_{IA}$ are proportional and integral gains for the amplitude control loop, $I_d$ and I are desired and actual current levels through the transducer, $V_{max}$ is the maximal voltage on the transducer up to which the current would be controlled, V is the actual voltage on the transducer measured during the control, and $k_{PV}$ is the voltage proportional gain. If the voltage on the transducer V becomes larger than the maximal voltage $V_{max}$, the current control is replaced by voltage control around the maximal voltage, until the voltage drops below its maximal value. The voltage limiting is introduced to protect the power amplifier from overloading. The maximal voltage $V_{max}$ may be determined during product development. The desired current $I_d$ is determined from a user specification of a desired oscillation amplitude. In order to eliminate accumulation of large integral error during the initial transition of the current from an initial value to the moment when the desired current is reached for the first time (which could cause large overshoot), the integral part of the control may be introduced only after reaching the desired current for the first time.

Figure 4:
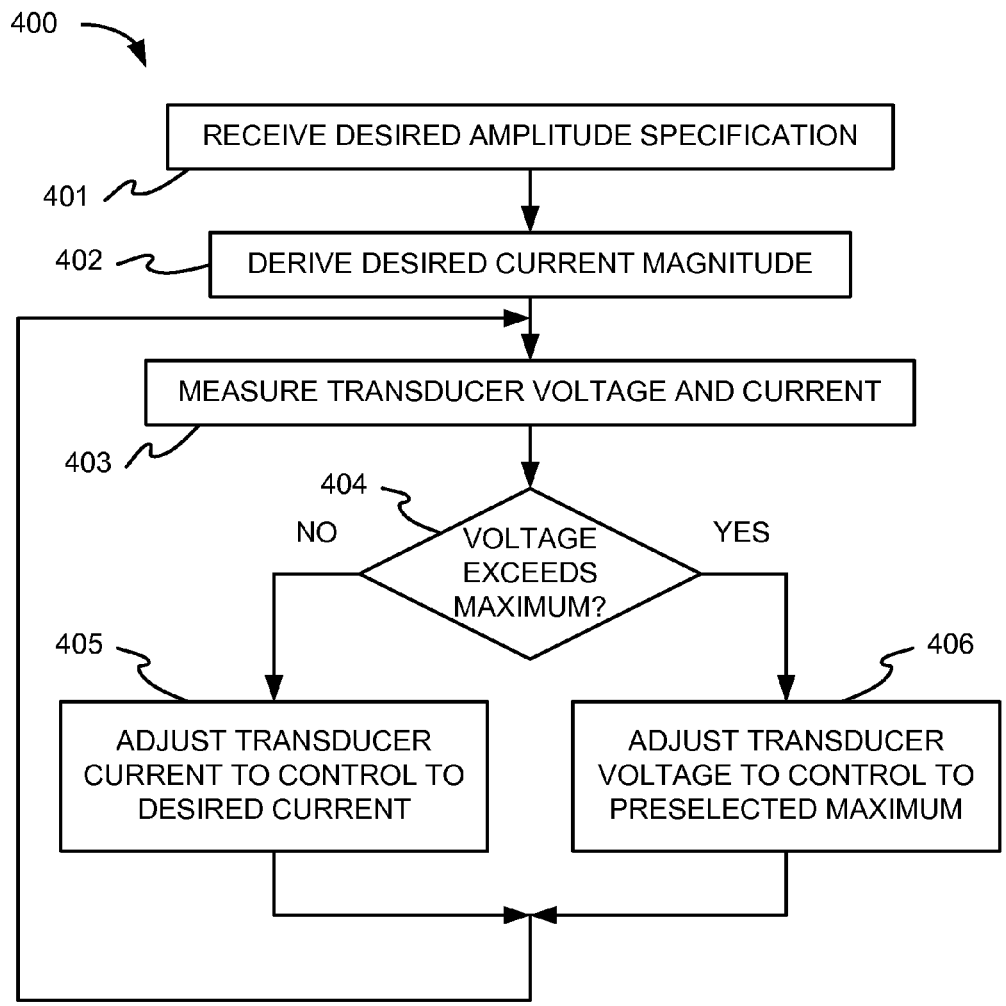
FIG. 4 is a simplified flowchart illustrating an embodiment of current-based amplitude control.

FIG. 4 is a simplified flowchart 400 illustrating an embodiment of current-based amplitude control. At step 401, a desired amplitude specification is received, for example through user interface 202. At step 402, a desired current magnitude corresponding to the desired oscillation amplitude is derived. Control processor 201 may derive the desired current magnitude based on a characterization of the system performed during product development. At step 403, the voltage magnitude on ultrasonic transducer 106 and the magnitude of the current passing through ultrasonic transducer 106 are measured. In the case of both current and voltage, a "magnitude" maybe a peak value, an RMS value, or another value that indicates the amount of voltage or current. At step 404, the transducer voltage is compared with a preselected maximum voltage. If the voltage does not exceed the maximum, control passes to step 405, where the current passing through ultrasonic transducer 106 is adjusted so as to control the current passing through the ultrasonic transducer to the desired current magnitude. If the voltage does exceed the maximum, control passes to step 406, where the voltage on the transducer is adjusted so as to control the voltage on the ultrasonic transducer to the preselected maximum transducer voltage. Either adjustment may be made by adjusting the amplitude of the oscillating signal produced by waveform generator 203.

Steps 405 and 406 are simplified for ease of explanation. The adjustment of current performed in step 405 may be performed in accordance with a proportional-integral control law, with the integral term introduced only after the desired current has been reached for the first time. The adjustment of voltage performed in step 406 may be performed in accordance with a proportional control law. Preferably, if voltage control is entered, the integral term of the control law is maintained at a zero value during the voltage control to prevent the accumulation of large integral errors during the voltage control.

Voltage Based Amplitude Control

According to other embodiments, the control variable for controlling amplitude is the voltage being supplied to ultrasonic transducer 106, the limiting variable is the current passing through ultrasonic transducer 106, and control is performed using a control law according to $$\Delta U_A = \begin{cases} k_{PA}(V_d - V) + k_{IA} \int (V_d - V) dt, & I \le I_{max} \\ k_{PI}(I_{max} - I), & I > I_{max} \end{cases}$$

where $\Delta U_A$ is the increment of the amplitude control variable in each control period, $k_{PA}$ and $k_{IA}$ are proportional and integral gains for the amplitude control loop, $V_d$ and $V$ are desired and actual voltage levels on the transducer, $I_{max}$ is the maximal current on the transducer up to which the voltage would be controlled, I is the actual current on the transducer measured during the control, and $k_{PI}$ is the current proportional gain. If the current of the transducer I becomes larger than the maximal allowed current $I_{max}$, the voltage control is replaced by current control around maximal current, until the current drops below its maximal value. The current limiting is introduced to protect the power amplifier from overloading. The maximal current $I_{max}$ may be determined during product development. The desired voltage $V_d$ is determined from a user specification of a desired oscillation amplitude. In order to eliminate accumulation of large integral error during the initial transition of the voltage from an initial value to the moment when the desired voltage is reached for the first time (which could cause large overshoot), the integral part of the control may be introduced only after reaching the desired voltage for the first time.

A flow chart of voltage based amplitude control would be very similar to the flow chart of FIG. 4, with voltage and current interchanged.

Power Based Amplitude Control

According to other embodiments, the control variable for controlling amplitude is the power being supplied to ultrasonic transducer 106, the limiting variable is the voltage on ultrasonic transducer 106, and control is performed using a control law according to $$\Delta U_A = \begin{cases} k_{PA}(P_d - P) + k_{IA} \int (P_d - P) dt, & V \le V_{max} \\ k_{PV}(V_{max} - V), & V > V_{max} \end{cases}$$

where $\Delta U_A$ is the increment of the amplitude control variable in each control period, $k_{PA}$ and $k_{IA}$ are positional and integral gains for the amplitude control loop, $P_d$ and $P$ are desired and actual power consumption levels for the transducer, $V_{max}$ is the maximal voltage on the transducer up to which the power would be controlled, V is the actual voltage on the transducer measured during the control, and $k_{PV}$ is the voltage positional gain. If the voltage on the transducer V becomes equal or larger than the maximal allowed voltage $V_{max}$, the power control is replaced by voltage control around maximal voltage, until the voltage drops below its maximal value. The voltage limiting is introduced to protect the power amplifier from overloading. The maximal voltage $V_{max}$ may be determined during product development. The desired power $P_d$ is determined from a user specification of a desired oscillation amplitude. In order to eliminate accumulation of large integral error during the initial transition of the power from an initial value to the moment when the desired power is reached for the first time (which could cause large overshoot), the integral part of the control may be introduced only after reaching the desired power for the first time.

Figure 5:
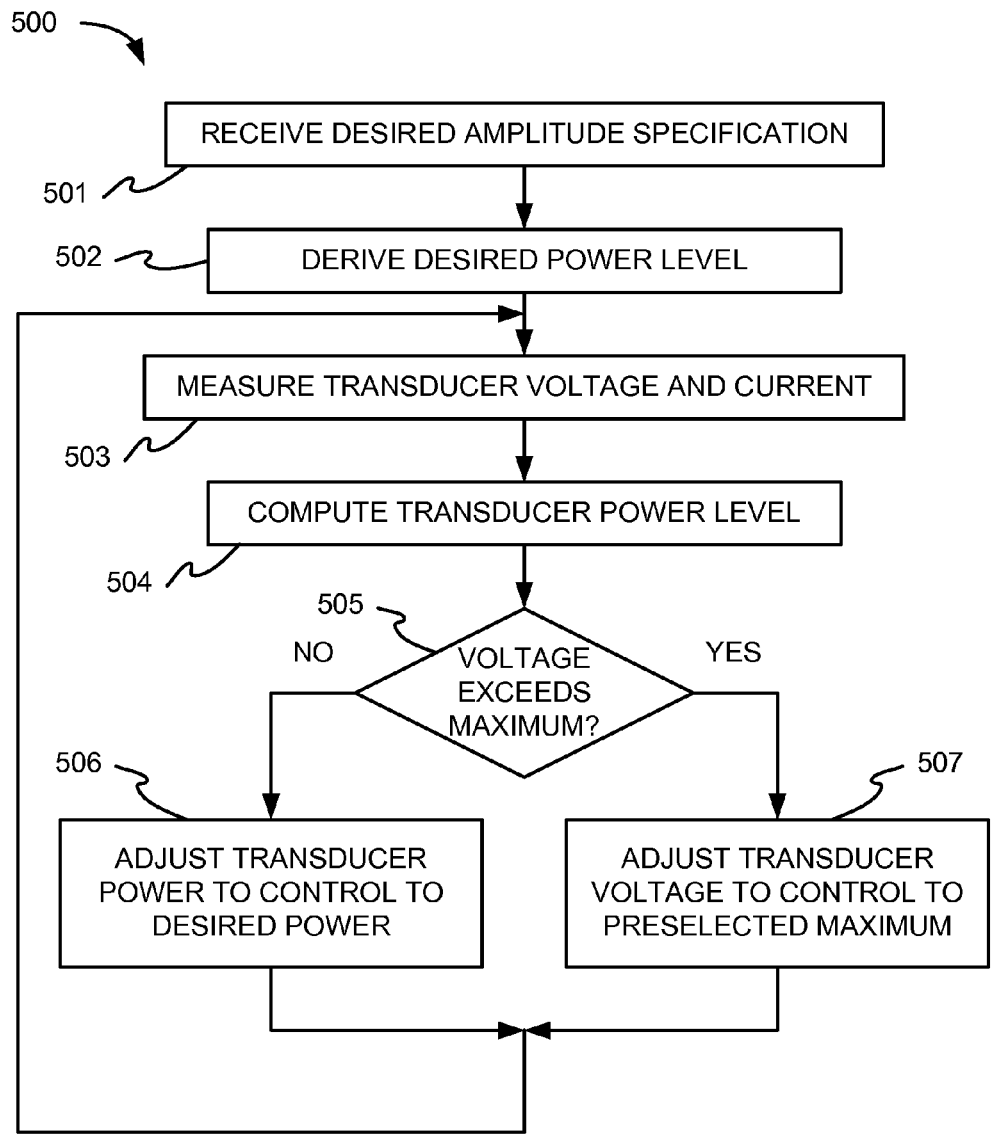
FIG. 5 is a simplified flowchart illustrating an embodiment of power-based amplitude control.

FIG. 5 is a simplified flowchart 500 illustrating an embodiment of power-based amplitude control. At step 501, a desired amplitude specification is received, for example through user interface 202. At step 502, a desired power level corresponding to the desired oscillation amplitude is derived. Control processor 201 may derive the desired power level based on a characterization of the system performed during product development. At step 503, the voltage on ultrasonic transducer 106 and the current passing through ultrasonic transducer 106 are measured. At step 504, the amount of power being supplied to ultrasonic transducer 106 is computed from the voltage and current. In other embodiments, a power meter may provide an indication of the power being supplied to ultrasonic transducer 106 to control processor 201. At step 505, the transducer voltage is compared with a preselected maximum voltage. If the voltage does not exceed the maximum, control passes to step 506, where the power being supplied to ultrasonic transducer 106 is adjusted so as to control the power being supplied to the ultrasonic transducer to the desired power level. If the voltage does exceed the maximum, control passes to step 507, where the voltage on the transducer is adjusted so as to control the voltage on the ultrasonic transducer to the preselected maximum transducer voltage. Either adjustment may be made by adjusting the amplitude of the oscillating signal produced by waveform generator 203.

Steps 506 and 507 are simplified for ease of explanation. The adjustment of power performed in step 506 may be performed in accordance with a proportional-integral control law, with the integral term introduced only after the desired power level has been reached for the first time. The adjustment of voltage performed in step 507 may be performed in accordance with a proportional control law. Preferably, if voltage control is entered, the integral term of the control law is maintained at a zero value during the voltage control to prevent the accumulation of large integral errors during the voltage control.

Simultaneous Frequency and Amplitude Control

Preferably, both frequency control and amplitude control as described above may be performed simultaneously, so that both frequency and amplitude are under closed loop feedback control.

Figure 6:
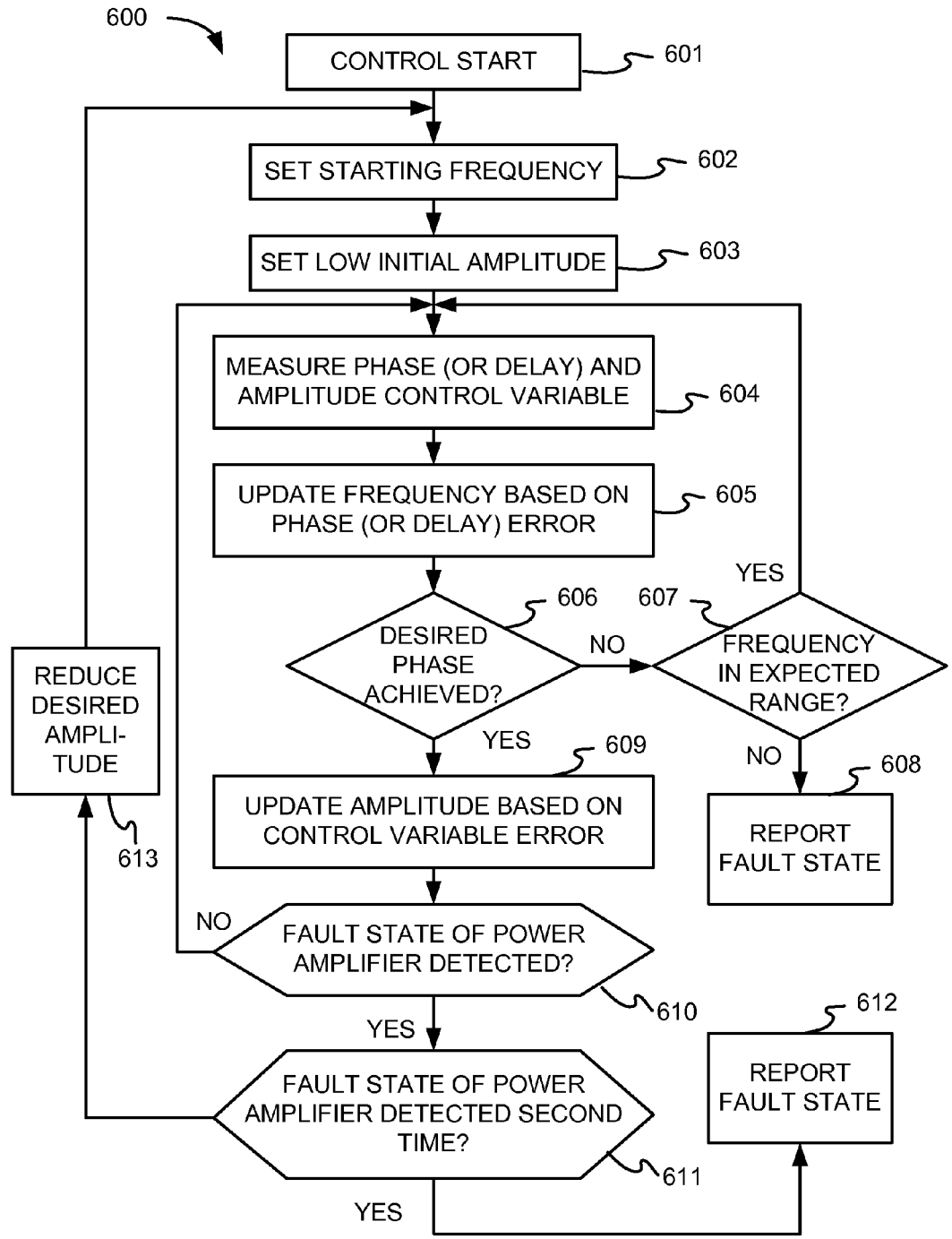
FIG. 6 is a simplified flow chart illustrating an embodiment of simultaneous frequency and amplitude control.

FIG. 6 is a simplified flow chart 600 illustrating an embodiment of simultaneous frequency and amplitude control. Upon initiation of control 601, a starting frequency is set at step 602. As is described above, the starting frequency may be the lowest or highest expected resonance frequency, or another frequency. An initial amplitude level may also be set at step 603. At step 604, the relative phase of the voltage on the transducer and the current passing through the transducer is measured. As is describe above, a relative time delay between these two signals may be substituted for the phase. Also, any control variables needed for amplitude control may be measured or determined. For example, voltage and current may be measured, and power may be computed if needed. At step 605, the frequency is updated based on the measured phase or time delay error from the desired phase or time delay. The frequency update may be performed in accordance with a control law, which may be a proportional-integral control law, a proportional control law, a combination of these, or another kind of control law.

At step 606, a check is performed to see if the desired phase or time delay has been achieved for the first time. If not, another check is performed at step 607 to see if the frequency has reached a value that is outside the range of expected frequencies. If the frequency is outside the range of expected frequencies, a fault state is reported and control stops at step 608, but if the frequency is within the range of expected frequencies, control passes back to step 604.

If the desired phase or delay has been reached for the first time, control passes to step 609, where the oscillation amplitude is adjusted. The update of the amplitude may be performed in accordance with one of the exemplary control laws described above, or another control law.

At step 610, a check is performed to see if a fault has been reported for the power amplifier. If not, control passes to step 604 and the closed loop control continues. If a power amplifier fault is present, a check is performed at step 611 to see whether it is a second fault. If so, control passes to step 612 where a fault state is reported and control stops. If the power amplifier is not a second fault, control passes to step 613, where the desired amplitude may be reduced by a few percent, and then control resumes at step 602.

In the claims appended hereto, the term "a" or "an" is intended to mean "one or more." The term "comprise" and variations thereof such as "comprises" and "comprising," when preceding the recitation of a step or an element, are intended to mean that the addition of further steps or elements is optional and not excluded. The invention has now been described in detail for the purposes of clarity and understanding. However, those skilled in the art will appreciate that certain changes and modifications may be practiced within the scope of the appended claims.

What is claimed is:

1. A system for controlling an ultrasonic transducer, the system comprising:
   a control processor;
   a waveform generator that produces an oscillating signal, wherein the frequency of the oscillating signal is adjustable under control of the control processor;
   power circuitry that receives the oscillating signal and drives the ultrasonic transducer to vibrate at the frequency of the oscillating signal, wherein the power circuitry further comprises a power amplifier that receives the oscillating signal and produces an amplified oscillating signal, and a high frequency transformer that includes a primary winding and a secondary winding, wherein the primary winding receives the amplified oscillating signal and the secondary winding is coupled to the ultrasonic transducer, the output of the secondary winding driving the ultrasonic transducer;
   a current sensing circuit that senses the current passing through the ultrasonic transducer;
   a voltage sensing circuit that senses the voltage on the ultrasonic transducer; and
   a phase detection circuit that receives signals from the current sensing circuit and the voltage sensing circuit and produces an indication of the relative phase of the voltage and the current and provides the indication to the control processor;
   wherein the control processor is configured to repeatedly read the indication of the relative phase of the voltage and the current and adjust the frequency of the oscillating signal so as to control the indication of relative phase of the voltage and the current to a value that has been preselected to correspond to resonance of an electromechanical system that includes the ultrasonic transducer;
   and wherein the control processor adjusts the frequency of the oscillating signal according to a proportional-integral control law.

2. The system for controlling an ultrasonic transducer of claim 1, wherein the control processor is further configured to:
   upon initiation of control adjust the frequency of the oscillating signal according to a proportional control law;
   detect that the relative phase of the voltage and the current has reached the preselected value for a first time; and
   then adjust the frequency of the oscillating signal according to a proportional-integral control law.

3. The system for controlling an ultrasonic transducer of claim 1, wherein the indication of the relative phase of the voltage and the current is a measure of the time delay between a current waveform and a voltage waveform.

4. The system for controlling an ultrasonic transducer of claim 1, wherein the amplitude of the oscillating signal is adjustable under control of the control processor.

5. The system for controlling an ultrasonic transducer of claim 4, wherein the control processor receives a signal from the current sensing circuit, and the control processor is further configured to:
   receive a specification of a desired ultrasonic transducer vibration amplitude;
   derive a desired current magnitude from the desired ultrasonic transducer vibration amplitude; and repeatedly read the signal received from the current sensing circuit and adjust the amplitude of the oscillating signal so as to control the current passing through the ultrasonic transducer to the desired current magnitude.

6. The system for controlling an ultrasonic transducer of claim 5, wherein:
the control of the current passing through the ultrasonic transducer is performed according to a proportional-integral control law at least some of the time.

7. The system for controlling an ultrasonic transducer of claim 6, wherein the control processor is configured to:
upon initiation of control, control the current passing through the ultrasonic transducer according to a proportional control law;
detect that the current passing through the ultrasonic transducer has reached the desired current magnitude for a first time; and
then control the current passing through the ultrasonic transducer according to a proportional-integral control law.

8. The system for controlling an ultrasonic transducer of claim 5, wherein the control processor is further configured to:
compare the magnitude of the voltage on the ultrasonic transducer with a preselected maximum transducer voltage; and
when the magnitude of the voltage on the ultrasonic transducer exceeds the preselected maximum transducer voltage, adjust the amplitude of the oscillating signal so as to control the voltage on the ultrasonic transducer to the preselected maximum transducer voltage.

9. The system for controlling an ultrasonic transducer of claim 8, wherein the control of the voltage on the ultrasonic transducer is performed according to a proportional control law.

10. The system for controlling an ultrasonic transducer of claim 4, wherein the control processor receives a signal from the voltage sensing circuit, and the control processor is further configured to:
receive a specification of a desired ultrasonic transducer vibration amplitude;
derive a desired voltage magnitude from the desired ultrasonic transducer vibration amplitude; and
repeatedly read the signal received from the voltage sensing circuit and adjust the amplitude of the oscillating signal so as to control the voltage on the ultrasonic transducer to the desired voltage magnitude.

11. The system for controlling an ultrasonic transducer of claim 10, wherein:
the control of the voltage on the ultrasonic transducer is performed according to a proportional-integral control law at least some of the time.

12. The system for controlling an ultrasonic transducer of claim 11, wherein the control processor is configured to:
upon initiation of control, control the voltage on the ultrasonic transducer according to a proportional control law;
detect that the voltage the ultrasonic transducer has reached the desired voltage magnitude for a first time; and
then control the voltage on the ultrasonic transducer according to a proportional-integral control law.

13. The system for controlling an ultrasonic transducer of claim 10, wherein the control processor is further configured to:
compare the magnitude of the current passing through the ultrasonic transducer with a preselected maximum transducer current; and
when the magnitude of the current passing through the ultrasonic transducer exceeds the preselected maximum transducer current, adjust the amplitude of the oscillating signal so as to control the current passing through the ultrasonic transducer to the preselected maximum transducer current.

14. The system for controlling an ultrasonic transducer of claim 13, wherein the control of the current passing through the ultrasonic transducer is performed according to a proportional control law.

15. The system for controlling an ultrasonic transducer of claim 4, wherein the control processor receives signals from the current sensing circuit and from the voltage sensing circuit, and the control processor is further configured to:
receive a specification of a desired ultrasonic transducer vibration amplitude;
derive a desired power level from the desired ultrasonic transducer vibration amplitude; and
repeatedly read the signal received from the voltage sensing circuit and the signal received from the current sensing circuit, compute a power level being supplied to the transducer, and adjust the amplitude of the oscillating signal so as to control the power being supplied to the ultrasonic transducer to the desired power level.

16. The system for controlling an ultrasonic transducer of claim 15, wherein:
the control of the power being supplied to the ultrasonic transducer is performed according to a proportional-integral control law at least some of the time.

17. The system for controlling an ultrasonic transducer of claim 16, wherein the control processor is configured to:
upon initiation of control, control the power being supplied to the ultrasonic transducer according to a proportional control law;
detect that the power being supplied to the ultrasonic transducer has reached the desired power level for a first time; and
then control the power being supplied to the ultrasonic transducer according to a proportional-integral control law.

18. The system for controlling an ultrasonic transducer of claim 15, wherein the control processor is further configured to:
compare the magnitude of the voltage on the ultrasonic transducer with a preselected maximum transducer voltage; and
when the magnitude of the voltage on the ultrasonic transducer exceeds the preselected maximum transducer voltage, adjust the amplitude of the oscillating signal so as to control the voltage on the ultrasonic transducer to the preselected maximum transducer voltage.

19. The system for controlling an ultrasonic transducer of claim 18, wherein the control of the voltage on the ultrasonic transducer is performed according to a proportional control law.

20. The system for controlling an ultrasonic transducer of claim 4, wherein the control processor is further configured to:
upon initiation of control, adjust the amplitude of the oscillating signal to a preselected level and control the frequency of the oscillating signal without adjusting its amplitude;
detect that a resonant frequency of the electromechanical system has been reached for a first time; and
then repeatedly adjust both the frequency and amplitude of the oscillating signal.

21. A method of controlling an ultrasonic transducer, the method comprising repeatedly:
- sensing the current passing through the ultrasonic transducer;
- sensing the voltage on the ultrasonic transducer;
- deriving an indication of the relative phase of the voltage and the current;
- sending a command to a waveform generator to adjust a frequency at which the ultrasonic transducer is driven, so as to control the indication of relative phase of the voltage and the current to a value that has been preselected to correspond to resonance of an electromechanical system that includes the ultrasonic transducer;
- providing an oscillating signal output from the waveform generator to a power amplifier that produces an amplified oscillating signal; and
- providing the amplified oscillating signal to a high frequency transformer that includes a primary winding and a secondary winding, wherein the primary winding receives the amplified oscillating signal and the secondary winding is coupled to the ultrasonic transducer, the output of the secondary winding driving the ultrasonic transducer;
- wherein the frequency is adjusted according to a proportional-integral control law.

22. The method of claim 21, wherein the frequency is adjusted according to a proportional control law until the preselected value of the phase indication is reached for a first time, and then the frequency is adjusted according to a proportional-integral control law.

23. The method of claim 21, further comprising measuring a time delay between a current waveform and a voltage waveform, and using the measured time delay as the indication of the relative phase of the voltage and the current.

24. The method of claim 21, further comprising controlling the amplitude of oscillation of the ultrasonic transducer.

25. The method of claim 24, wherein controlling the amplitude of oscillation of the ultrasonic transducer further comprises controlling the current passing through the ultrasonic transducer to a magnitude that corresponds to a desired amplitude of oscillation of the ultrasonic transducer.

26. The method of claim 25, wherein the current is controlled according to a proportional-integral control law at least some of the time.

27. The method of claim 25, further comprising:
- upon initiation of control, controlling the current passing through the ultrasonic transducer according to a proportional control law;
- detecting that the current passing through the ultrasonic transducer has reached the magnitude corresponding to the desired amplitude for a first time; and
- then controlling the current passing through the ultrasonic transducer according to a proportional-integral control law.

28. The method of claim 24, further comprising:
- when the magnitude of the voltage on the ultrasonic transducer does not exceed a preselected maximum transducer voltage, controlling the current passing through the ultrasonic transducer to a magnitude that corresponds to a desired amplitude of oscillation of the ultrasonic transducer; and
- when the magnitude of the voltage on the ultrasonic transducer exceeds the preselected maximum transducer voltage, controlling the voltage on the ultrasonic transducer to the preselected maximum transducer voltage.

29. The method of claim 28, wherein the control of the voltage on the ultrasonic transducer is performed according to a proportional control law.

30. The method of claim 24, wherein controlling the amplitude of oscillation of the ultrasonic transducer further comprises controlling the voltage on the ultrasonic transducer to a magnitude that corresponds to a desired amplitude of oscillation of the ultrasonic transducer.

31. The method of claim 30, wherein the voltage is controlled according to a proportional-integral control law at least some of the time.

32. The method of claim 30, further comprising:
- upon initiation of control, controlling the voltage on the ultrasonic transducer according to a proportional control law;
- detecting that the voltage on the ultrasonic transducer has reached the magnitude corresponding to the desired amplitude for a first time; and
- then controlling the voltage on the ultrasonic transducer according to a proportional-integral control law.

33. The method of claim 24, further comprising:
- when the magnitude of the current passing through the ultrasonic transducer does not exceed a preselected maximum transducer current, controlling the voltage on the ultrasonic transducer to a magnitude that corresponds to a desired amplitude of oscillation of the ultrasonic transducer; and
- when the magnitude of the current passing through the ultrasonic transducer exceeds the preselected maximum transducer current, controlling the current passing through the ultrasonic transducer to the preselected maximum transducer current.

34. The method of claim 33, wherein the control of the current passing through the ultrasonic transducer is performed according to a proportional control law.

35. The method of claim 24, wherein controlling the amplitude of oscillation of the ultrasonic transducer further comprises controlling the amount of power being supplied to the ultrasonic transducer to a value that corresponds to a desired amplitude of oscillation of the ultrasonic transducer.

36. The method of claim 35, wherein the power is controlled according to a proportional-integral control law at least some of the time.

37. The method of claim 35, further comprising:
- upon initiation of control, controlling the amount of power being supplied to the ultrasonic transducer according to a proportional control law;
- detecting that the amount of power being supplied to the ultrasonic transducer has reached the value corresponding to the desired amplitude for a first time; and
- then controlling the amount of power being supplied to the ultrasonic transducer according to a proportional-integral control law.

38. The method of claim 35, further comprising:
- when the magnitude of the voltage on the ultrasonic transducer does not exceed a preselected maximum transducer voltage, controlling the amount of power being supplied to the ultrasonic transducer to a value that corresponds to a desired amplitude of oscillation of the ultrasonic transducer; and
- when the magnitude of the voltage on the ultrasonic transducer exceeds the preselected maximum transducer voltage, controlling the voltage on the ultrasonic transducer to the preselected maximum transducer voltage.

39. The method of claim 38, wherein the control of the voltage on the ultrasonic transducer is performed according to a proportional control law.

40. The method of claim 24, further comprising:
upon initiation of control, setting the amplitude of oscillation of the ultrasonic transducer to a preselected level and controlling the frequency of oscillation of the ultrasonic transducer without adjusting its amplitude;
detecting that the preselected value of the indication of relative phase of the voltage and current corresponding to the resonant frequency of the electromechanical system has been reached for a first time; and
then controlling both the frequency and amplitude of the oscillation of the ultrasonic transducer.

* * * * *